(12) United States Patent
Burak et al.

(10) Patent No.: US 9,484,882 B2
(45) Date of Patent: Nov. 1, 2016

(54) ACOUSTIC RESONATOR HAVING TEMPERATURE COMPENSATION

(71) Applicant: Avago Technologies General IP (Singapore) Pte. Ltd., Singapore (SG)

(72) Inventors: Dariusz Burak, Fort Collins, CO (US); John Choy, Westminster, CO (US); Kevin J. Grannen, Thornton, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 338 days.

(21) Appl. No.: 13/767,754

(22) Filed: Feb. 14, 2013

(65) Prior Publication Data

US 2014/0225682 A1    Aug. 14, 2014

(51) Int. Cl.
*H03H 9/15* (2006.01)
*H03H 9/02* (2006.01)
*H03H 9/17* (2006.01)

(52) U.S. Cl.
CPC ........ *H03H 9/02102* (2013.01); *H03H 9/0211* (2013.01); *H03H 9/02118* (2013.01); *H03H 9/173* (2013.01); *H03H 9/175* (2013.01)

(58) Field of Classification Search
CPC .......... H03H 9/02102; H03H 9/0211; H03H 9/02118; H03H 9/0504; H03H 9/172–9/175; H03H 9/586–9/589
USPC .......... 333/187–189; 310/322, 324, 335, 346
See application file for complete search history.

(56) References Cited

U.S. PATENT DOCUMENTS

| | | | |
|---|---|---|---|
| 5,587,620 A | 12/1996 | Ruby et al. | |
| 5,873,153 A | 2/1999 | Ruby et al. | |
| 6,107,721 A | 8/2000 | Lakin | |
| 6,291,931 B1 | 9/2001 | Lakin | |
| 6,384,697 B1 | 5/2002 | Ruby | |
| 6,466,105 B1 * | 10/2002 | Lobl et al. | 333/187 |
| 6,507,983 B1 | 1/2003 | Ruby et al. | |
| 6,548,943 B2 | 4/2003 | Kaitila et al. | |
| 6,709,776 B2 | 3/2004 | Noguchi et al. | |
| 6,864,619 B2 | 3/2005 | Aigner et al. | |
| 6,936,837 B2 | 8/2005 | Yamada et al. | |
| 6,943,647 B2 * | 9/2005 | Aigner et al. | 333/187 |
| 7,140,084 B2 * | 11/2006 | Yamada et al. | 29/25.35 |
| 7,199,683 B2 | 4/2007 | Thalhammer | |

(Continued)

FOREIGN PATENT DOCUMENTS

| | | | |
|---|---|---|---|
| JP | 63-82116 | * 4/1988 | 333/187 |
| JP | 2006-186412 | * 7/2006 | |

(Continued)

OTHER PUBLICATIONS

English language machine translation of JP 2006-186412, published Jul. 13, 2006, 9 pages.*

(Continued)

*Primary Examiner* — Barbara Summons

(57) ABSTRACT

An acoustic resonator structure comprises a substrate having an air cavity, an acoustic stack disposed over the substrate and comprising a piezoelectric material disposed between a first electrode and a second electrode, and an acoustic reflector disposed over the substrate and comprising a single pair of acoustic impedance layers configured to reflect acoustic waves produced by vibration of the acoustic stack, wherein at least one of the acoustic impedance layers comprises a temperature compensating material.

27 Claims, 19 Drawing Sheets

(56) References Cited

U.S. PATENT DOCUMENTS

| | | | |
|---|---|---|---|
| 7,275,292 B2 | 10/2007 | Ruby et al. | |
| 7,280,007 B2 | 10/2007 | Feng et al. | |
| 7,304,551 B2* | 12/2007 | Kawamura | 333/133 |
| 7,345,410 B2 | 3/2008 | Grannen et al. | |
| 7,348,714 B2* | 3/2008 | Inoue et al. | 310/335 |
| 7,388,454 B2 | 6/2008 | Ruby et al. | |
| 7,408,428 B2 | 8/2008 | Larson, III | |
| 7,435,613 B2* | 10/2008 | Barber et al. | H03H 3/007 438/53 |
| 7,466,213 B2* | 12/2008 | Lobl | H03H 3/04 310/322 |
| 7,491,569 B2* | 2/2009 | Fattinger et al. | H03H 3/02 257/E21.505 |
| 7,535,154 B2* | 5/2009 | Umeda et al. | 310/320 |
| 7,561,009 B2* | 7/2009 | Larson et al. | 333/187 |
| 7,575,292 B2 | 8/2009 | Furukawa | |
| 7,629,865 B2 | 12/2009 | Ruby | |
| 7,657,983 B2* | 2/2010 | Aigner | H03H 3/02 216/38 |
| 7,714,684 B2* | 5/2010 | Ruby et al. | 333/187 |
| 7,758,979 B2 | 7/2010 | Akiyama et al. | |
| 7,986,198 B2 | 7/2011 | Nakatsuka et al. | |
| 8,008,993 B2* | 8/2011 | Milsom et al. | H03H 9/0211 310/312 |
| 8,330,325 B1 | 12/2012 | Burak et al. | |
| 8,575,820 B2 | 11/2013 | Shirakawa et al. | |
| 2004/0046622 A1 | 3/2004 | Aigner et al. | |
| 2004/0183400 A1* | 9/2004 | Aigner et al. | 310/326 |
| 2007/0205850 A1 | 9/2007 | Jamneala et al. | |
| 2008/0258842 A1 | 10/2008 | Ruby et al. | |
| 2010/0039000 A1 | 2/2010 | Milson et al. | |
| 2010/0107400 A1 | 5/2010 | Fattinger | |
| 2010/0327697 A1 | 12/2010 | Choy et al. | |
| 2010/0327994 A1 | 12/2010 | Choy et al. | |
| 2011/0006860 A1* | 1/2011 | Hara et al. | 333/187 |
| 2011/0080233 A1* | 4/2011 | Petit et al. | 333/187 |
| 2011/0180391 A1 | 7/2011 | Larson et al. | |
| 2011/0227671 A1 | 9/2011 | Zhang | |
| 2011/0266925 A1 | 11/2011 | Ruby et al. | |
| 2012/0154074 A1 | 6/2012 | Ruby et al. | |
| 2012/0177816 A1 | 7/2012 | Larson, III et al. | |
| 2012/0218055 A1 | 8/2012 | Burak et al. | |
| 2012/0218056 A1 | 8/2012 | Burak et al. | |
| 2012/0218057 A1 | 8/2012 | Burak et al. | |
| 2012/0218058 A1 | 8/2012 | Burak et al. | |
| 2012/0218059 A1 | 8/2012 | Burak et al. | |
| 2012/0218060 A1 | 8/2012 | Burak et al. | |
| 2012/0319530 A1 | 12/2012 | Burak et al. | |
| 2012/0319534 A1 | 12/2012 | Shirakawa et al. | |
| 2013/0038408 A1 | 2/2013 | Burak et al. | |
| 2013/0063226 A1 | 3/2013 | Burak et al. | |
| 2013/0063227 A1 | 3/2013 | Burak et al. | |
| 2013/0106248 A1 | 5/2013 | Burak et al. | |
| 2013/0106534 A1 | 5/2013 | Burak et al. | |
| 2013/0205586 A1 | 8/2013 | Takada et al. | |
| 2013/0235001 A1 | 9/2013 | Yun et al. | |
| 2013/0241673 A1 | 9/2013 | Yokoyama et al. | |

FOREIGN PATENT DOCUMENTS

| | | |
|---|---|---|
| JP | 4471443 | 6/2010 |
| WO | WO2007085332 | 8/2007 |

OTHER PUBLICATIONS

Co-pending U.S. Appl. No. 13/658,024, filed Oct. 23, 2012.
Co-pending U.S. Appl. No. 13/663,449, filed Oct. 29, 2012.
Co-pending U.S. Appl. No. 13/660,941, filed Oct. 25, 2012.
Co-pending U.S. Appl. No. 13/654,718, filed Oct. 18, 2012.
Ranjan et al. "Strained Hexagonal ScN: A Material with Unusual Structural and Optical Properties," Physical Review Letters, Jun. 27, 2003, vol. 90, No. 25, The American Physical Society, USA, pp. 257602-1 to 257602-4.
Farrer et al., "Properties of hexagonal ScN versus wurtzite GaN and InN," Physical Review B, Nov. 20, 2002, vol. 66, No. 20, The American Physical Society, USA, pp. 201203-1 to 201203-4.
Constantin et al., "Composition-dependent structural properties in ScGaN alloy films: A combined experimental and theoretical study," Journal of Applied Physics, Dec. 16, 2005, vol. 98, No. 12, American Institute of Physics, USA, pp. 123501-1 to 123501-8.
Akiyama et al., "Enhancement of piezoelectric response in scandium aluminum nitride alloy thin films prepared by dual reactive cosputtering," Advanced Materials, 2009, vol. 21, pp. 593-596, Japan.
Suzuki et al., "Influence of shadowing effect on shear mode acoustic properties in the c-axis tilted AlN films," IEEE Ultrasonics Symposium (IUS), 2010, pp. 1478-1481.
Yanagitani et al., "Giant shear mode electromechanical coupling coefficient k12 in c-axis tilted ScAlN films," IEEE Ultrasonics Symposium (IUS), 2010, 4 pages.
"U.S. Appl. No. 13/232,334, filed Sep. 14, 2011".
"Co-pending U.S. Appl. No. 13/662,425, filed Oct. 27, 2012".
"Co-pending U.S. Appl. No. 13/767,765, filed Feb. 14, 2013".
"Co-pending U.S. Appl. No. 13/955,774, filed Jul. 31, 2013".
"Co-pending U.S. Appl. No. 14/092,077, filed Nov. 27, 2013".
Archibald, G. W., "Experimental Results of Bulk Acoustic Wave Transverse Graded Electrode Patterns", *Proceedings Of The 1998 IEEE International Frequency Control Symposium* 1998, 477-483.
Kerherve, , "BAW Technologies For Radiofrequency Filters And Duplexers", Nov. 2011, 89 pages.
Lin, , "Temperature Compensation Of Aluminum Nitride Lamb Wave Resonators Utilizing The Lowest-Order Symmetric Mode", *Electrical Engineering And Computer Sciences University Of California At Berkeley* Dec. 14, 2012, 94 pages.
Pineda, Humberto, "Thin-Film Bulk Acoustic Wave Resonators—FBAR", *Bellaterra, Monpelier* Dec. 2007, 1-241.
Umeda, Keiichi et al., "Piezoelectric Properties Of Scain Thin Films For Piezo-Mems Devices", *MEMS, 2013, Taipei, Taiwan, Jan. 20-24, 2013* pp. 733-736 2013.

\* cited by examiner

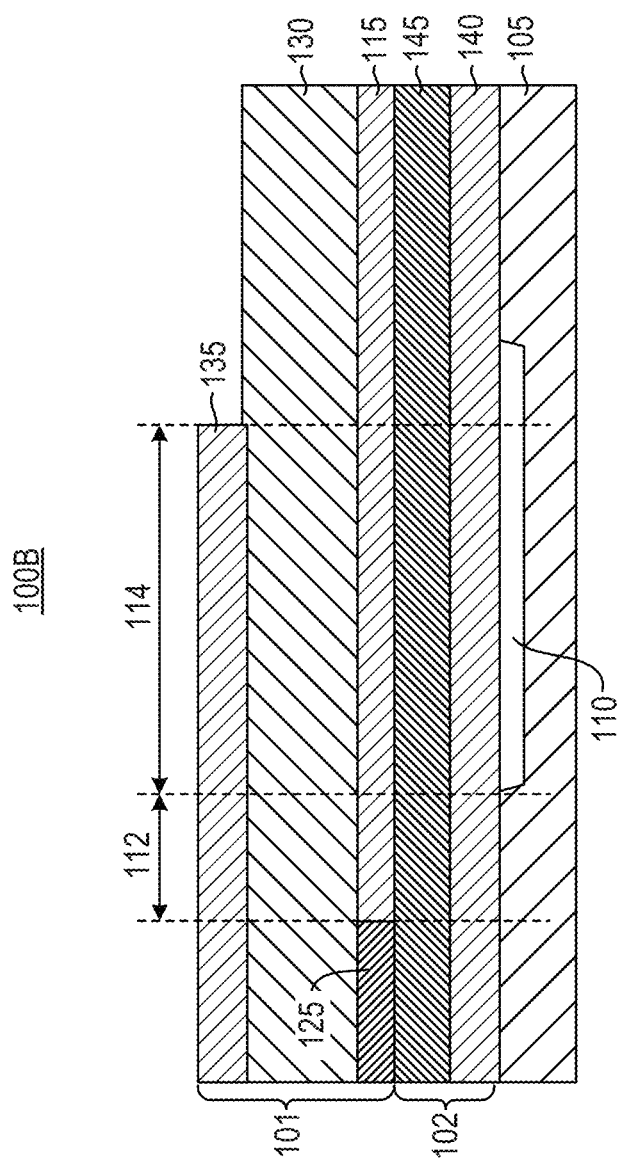

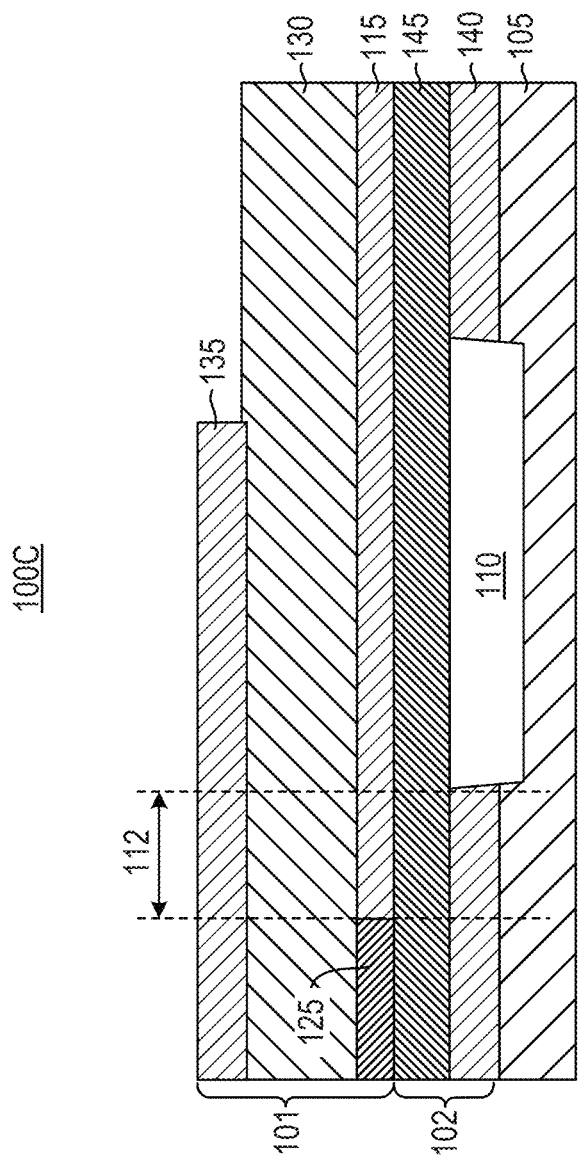

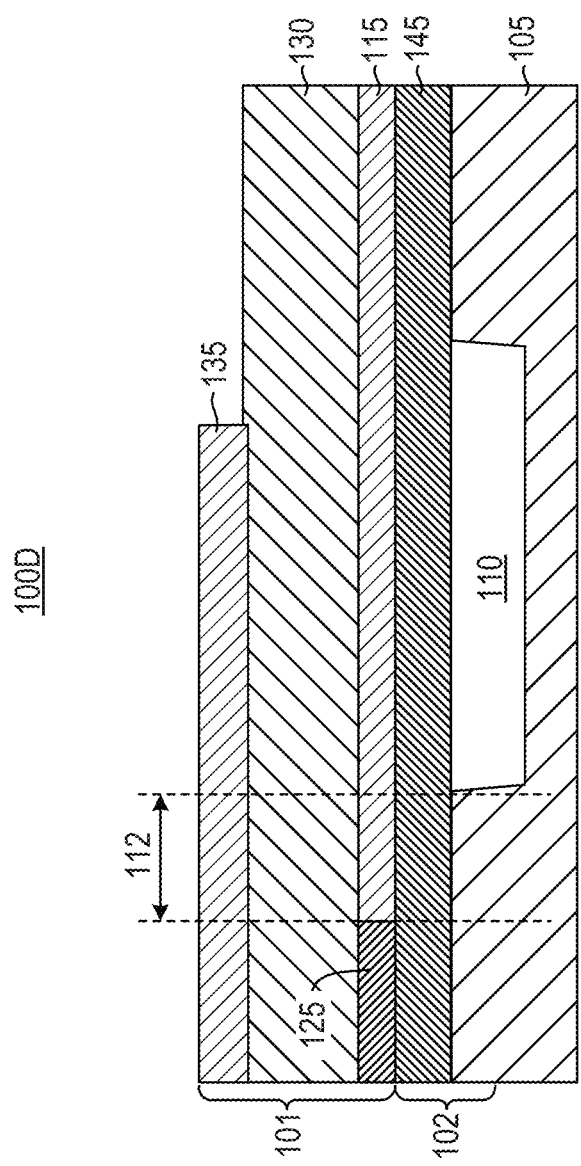

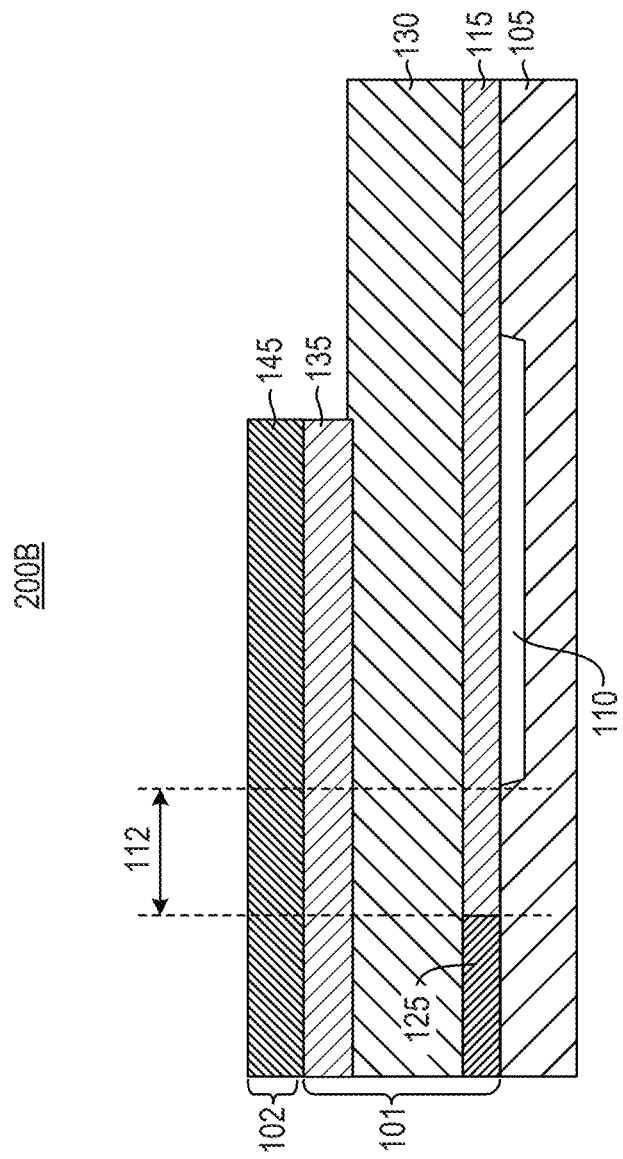

ACOUSTIC RESONATOR HAVING TEMPERATURE COMPENSATION

BACKGROUND

An acoustic resonator typically comprises a layer of piezoelectric material sandwiched between two plate electrodes in a structure referred to as an acoustic stack. Where an input electrical signal is applied between the electrodes, the reciprocal or inverse piezoelectric effect causes the acoustic stack to mechanically expand or contract depending on the polarization of the piezoelectric material. As the input electrical signal varies over time, expansion and contraction of the acoustic stack produces acoustic waves that propagate through the acoustic resonator in various directions and are converted into an output electrical signal by the piezoelectric effect. Some of the acoustic waves achieve resonance across the acoustic stack, with the resonant frequency being determined by factors such as the materials, dimensions, and operating conditions of the acoustic stack. These and other mechanical characteristics of the acoustic resonator determine its frequency response.

Many acoustic resonators have a frequency response with a passband characterized by center and cutoff frequencies. Such a frequency response makes these acoustic resonators attractive for a variety of electronic applications, with one example being frequency filters for communication equipment. Unfortunately, however, the passband of an acoustic resonator may vary with changes in temperature. For instance, as the ambient temperature increases, the passband may move toward lower frequencies because added heat tends to soften the materials that typically form the acoustic resonator, reducing their acoustic velocity.

To address this temperature dependent behavior, acoustic resonators are commonly designed with a relatively wide passband to allow for changes in the ambient temperature. Such a wide passband typically requires the acoustic resonator to have a relatively high electromechanical coupling coefficient ($Kt^2$), which may be difficult to achieve and may require additional processing steps such as scandium doping of an aluminum nitride (AlN) piezoelectric material. Moreover in some filters, such as those designed to operate in Band 13, the passband is not allowed to move because it may encroach on other (e.g., safety) bands.

In an effort to provide a stable passband in the presence of temperature changes, some acoustic resonators incorporate a temperature compensating material to counteract temperature-induced changes in the acoustic velocity of other resonator materials. For instance, an acoustic resonator may include an embedded layer of temperature compensating material whose acoustic velocity increases with increased temperature in order to counteract a reduction in the acoustic velocity of the piezoelectric material and electrodes.

One drawback of using the temperature compensating material is that it tends to redistribute acoustic energy within the acoustic stack, which may also increase excitation of spurious modes and diminish various performance metrics such as series resistance (Rs), parallel resistance (Rp) and overall quality factor (Q) across the pass-band spectrum. Accordingly, certain structures can be built into the acoustic resonator to counteract the reduction of these and other metrics. For example, air-bridges can be built over peripheral portions of the top electrode to reduce acoustic losses produced by interactions with an underlying substrate, and add-on frames can be formed over the top or bottom electrodes to minimize scattering of acoustic waves at the top electrode edges. These structures, in combination with the use of the temperature compensation material, tend to complicate the manufacture of the acoustic resonator. Accordingly, there is a general need for improved techniques for providing temperature compensation in acoustic resonators used in filters and other applications.

SUMMARY

In a representative embodiment, an acoustic resonator structure comprises a substrate having an air cavity, an acoustic stack disposed over the substrate and comprising a piezoelectric material disposed between a first electrode and a second electrode, and an acoustic reflector disposed over the substrate and comprising a single pair of acoustic impedance layers configured to reflect acoustic waves produced by vibration of the acoustic stack, wherein at least one of the acoustic impedance layers comprises a temperature compensating material.

In certain embodiments, the acoustic reflector is disposed on the substrate between the air cavity and the acoustic stack, the first electrode is disposed between the acoustic reflector and the piezoelectric layer, and the acoustic resonator structure further comprises a frame disposed around an active region of the acoustic stack between the second electrode and the piezoelectric layer or between the first electrode and the acoustic reflector. The frame can be, for instance, an add-on frame or a composite frame. Additionally, multiple frames can be located in one or more different layers of the acoustic stack.

In another representative embodiment, an acoustic resonator structure comprises a substrate having an air cavity, an acoustic stack disposed over the substrate and comprising a piezoelectric material disposed between a first electrode and a second electrode, and an acoustic reflector disposed over the substrate and comprising a single acoustic impedance layer formed of a temperature compensating material and configured to reflect acoustic waves produced by vibration of the acoustic stack.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 1B is a cross-sectional view of an acoustic resonator according to a representative embodiment.

FIG. 1C is a cross-sectional view of an acoustic resonator according to another representative embodiment.

FIG. 1D is a cross-sectional view of an acoustic resonator according to another representative embodiment.

FIG. 2B is a cross-sectional view of an acoustic resonator according to another representative embodiment.

DETAILED DESCRIPTION

Figure 1A:
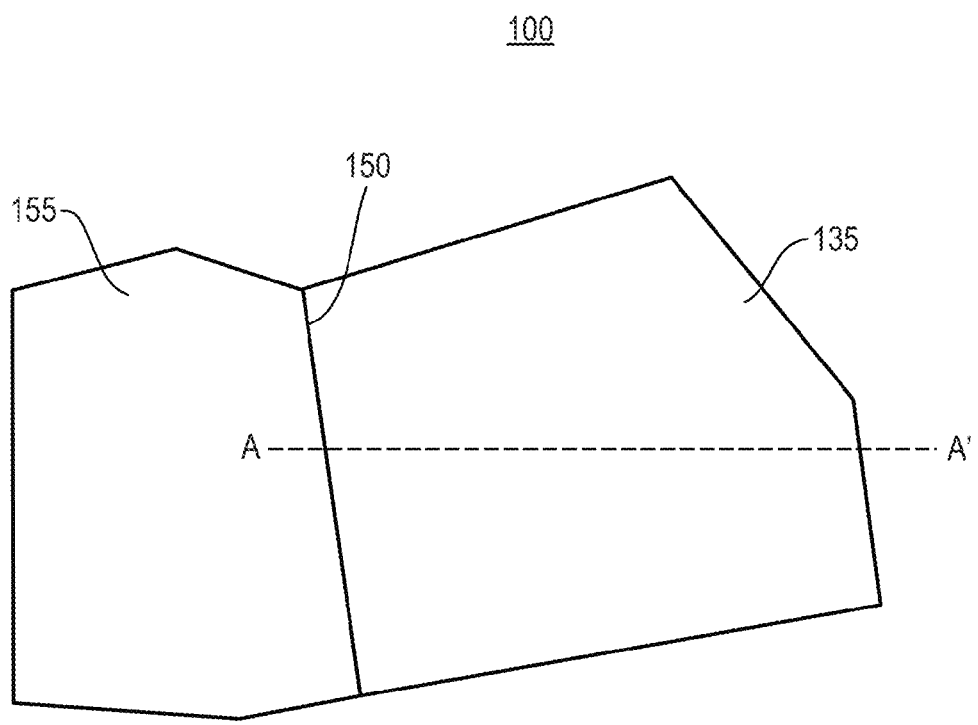
FIG. 1A is a top view of an acoustic resonator according to a representative embodiment.

In the following detailed description, for purposes of explanation and not limitation, example embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms 'a', 'an' and 'the' include both singular and plural referents, unless the context clearly dictates otherwise. Thus, for example, 'a device' includes one device and plural devices.

The terms 'substantial' or 'substantially' mean to within acceptable limits or degree. The term 'approximately' means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

The present teachings relate generally to acoustic resonators such as film bulk acoustic wave resonators (FBARs). Certain details of acoustic resonators, including materials and methods of fabrication, may be found in one or more of the following commonly owned U.S. Patents and Patent Applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. Patent App. Pub. No. 2010/0327697 to Choy et al.; U.S. Patent App. Pub. No. 2010/0327994 to Choy et al., U.S. patent application Ser. No. 13/658,024 to Nikkel et al.; U.S. patent application Ser. No. 13/663,449 to Burak et al.; U.S. patent application Ser. No. 13/660,941 to Burak et al.; U.S. patent application Ser. No. 13/654,718 to Burak et al.; U.S. Patent App. Pub. No. 2008/0258842 to Ruby et al.; and U.S. Pat. No. 6,548,943 to Kaitila et al. Certain details of temperature compensation in the context of acoustic resonators are described in U.S. Pat. No. 7,345,410 filed Mar. 22, 2006 to Grannen et al. and U.S. Pat. No. 7,408,428 filed Oct. 29, 2004 to Larson et al. The respective disclosures of the above patents and patent applications are specifically incorporated herein by reference. It is emphasized that the components, materials and method of fabrication described in these patents and patent applications are representative and other methods of fabrication and materials within the purview of one of ordinary skill in the art are contemplated.

In certain embodiments described below, an acoustic resonator is formed with a single pair of layers forming a Distributed Bragg Reflector (DBR), where one of the DBR layers is a temperature compensating layer. The DBR layers can be formed either under a bottom electrode or over a top electrode to provide temperature compensation of the resonator's response. If placed under the bottom electrode, such a structure also minimizes a detrimental impact of a so-called "dead-FBAR" region in which acoustic vibrations of the acoustic resonator may be attenuated through mechanical scattering of the electrically excited motion at a boundary between the bottom electrode and an underlying substrate. In addition, to compensate for possible reduction in Q and Rp due to the pair of DBR layers, frames may be formed in either both or any of top or bottom electrodes. If composite frames are used, they may also facilitate growth of relatively good-quality planar layers above electrodes containing these frames. As the DBR layers may introduce significant redistribution of energy across the acoustic stack, the frames may be placed at locations where they are relatively efficient in suppressing spurious modes.

Although the following description presents various embodiments related to FBAR technologies, the described concepts are not limited to FBAR technologies and may potentially be applied to other forms of acoustic resonators FIG. 1A is a top view of an acoustic resonator 100 according to a representative embodiment, and FIGS. 1B-1D are cross-sectional views of acoustic resonator 100, taken along a line A-A'. The cross-sectional views correspond to different variations of acoustic resonator 100 and will be referred to, respectively, as acoustic resonators 100B-100D. Acoustic resonators 100B-100D have many of the same features, so a repetitive description of these features may be omitted in an effort to avoid redundancy.

Referring to FIG. 1A, acoustic resonator 100 comprises a top electrode 135 having five (5) sides, with a connection side 150 configured to provide an electrical connection to interconnect 155. Interconnect 155 provides electrical signals to top electrode 135 to excite desired acoustic waves in a piezoelectric layer (not shown in FIG. 1A) of acoustic resonator 100.

Referring to FIG. 1B, acoustic resonator 100B comprises an acoustic stack 101, an acoustic reflector 102, and a substrate 105. Acoustic stack 101 comprises a piezoelectric layer 130 sandwiched between a first or bottom electrode 115 and a second or top electrode 135, and planarization layer 125 formed adjacent to bottom electrode 115. Additionally, a passivation layer (not shown) may be present on top of the top electrode 135 with thickness sufficient to insulate all layers of the resonator stack from the environment, including protection from moisture, corrosives, contaminants, debris and the like. Acoustic reflector 102 comprises a single pair of acoustic impedance layers 140 and 145 forming a Distributed Bragg Reflector (DBR) or other type of acoustic mirror. These layers are typically formed with respective thicknesses corresponding to a quarter wavelength of a natural resonance frequency of acoustic resonator 100B. Additionally, at least one of these layers is formed of a temperature compensating material. Substrate 105 has an air cavity 110 formed below acoustic reflector 102.

Acoustic reflector 102 is grown on top of substrate 105 and provides acoustic isolation between substrate 105 and acoustic stack 101 along the perimeter of the air cavity 110. Acoustic impedance layers 140 and 145 of acoustic reflector 102 are formed of materials having different acoustic impedances. For example, acoustic impedance layer 140 may be formed of a relatively high acoustic impedance material, such as tungsten (W) or molybdenum (Mo), while acoustic impedance layer 145 may be formed of a material having relatively low acoustic impedance, such as silicon oxide ($SiO_x$), where x is an integer. Both undoped and doped silicon oxide are temperature compensating materials and may therefore serve to stabilize the frequency response of acoustic resonator 100B with respect to temperature. In general, the amount of acoustic isolation provided by acoustic reflector 102 depends on the contrast between the acoustic impedances of acoustic impedance layers 140 and 145, with a greater amount of contrast creating better acoustic isolation. Accordingly, other things being equal, it may be desirable to form acoustic impedance layers 140 and 145 with highly contrasting acoustic impedances.

During typical operation of acoustic resonator 100B, a time-varying input electrical signal is applied to top electrode 135 through connection side 150. This input signal produces mechanical vibrations in an active region 114, or main membrane, of acoustic stack 101, which is defined as a region of overlap between bottom electrode 115, piezoelectric layer 130, top electrode 135, and air cavity 110. These vibrations occur freely due to the open space provided by air cavity 110. The input signal also produces vibrations all the way to a dead-FBAR region 112 of acoustic stack 101, which is defined as a region of overlap between bottom electrode 115, piezoelectric layer 130, and top electrode 135, but not air cavity 110. These vibrations are facilitated by the presence of acoustic reflector 102, which tends to reduce or eliminate scattering of acoustic energy at the edge of the substrate 105. In other words, acoustic reflector 102 reflects energy transmitted toward substrate so that it remains in acoustic stack 101.

In the absence of acoustic reflector 102, dead-FBAR region 112 may not vibrate significantly in direct response to the input signal. Instead, much of the electrical energy supplied to dead-FBAR region 112 may be scattered at the edge of substrate 105 or otherwise coupled into the substrate 105. At the same time, however, active region 114 may experience significant motion, which can result in excitation of spurious vibrations in dead-FBAR region 112. These spurious vibrations would typically occur due to an abrupt change in mechanical characteristics of acoustic stack 101 along a dotted line separating dead-FBAR region 112 and 114. Acoustic reflector 102, however, may mitigate the above shortcomings by preventing energy loss in dead-FBAR region 112 through reflection and by reducing spurious modes by eliminating to large degree the abrupt change in mechanical characteristics between dead-FBAR region 112 and active region 114. At the same time, air cavity 110 under the acoustic reflector 102 in the active region 114 provides acoustic isolation between the membrane of acoustic resonator 100B and the substrate 105.

Although FIG. 1B shows a single acoustic resonator 100B, acoustic reflector 102 may be included in a device with additional acoustic resonators, for example, in a filter including 5-10 acoustic resonators. In such a filter, acoustic impedance layers 140 and 145 would typically be electrically isolated from acoustic impedance layers of the other acoustic resonators. For example, a trench or other isolating means may be etched off around acoustic reflector 102 down to substrate 105 in the case of high-impedance layer 140 formed of conductive material like W or Mo. Notably, trench isolation can be avoided for dielectric materials used to form high acoustic impedance layer 140, like diamond-like carbon, aluminum oxide, silicon nitride or silicon carbide.

Referring to FIG. 1C, acoustic resonator 100C is substantially the same as acoustic resonator 100B, except that acoustic impedance layer 140 has been etched away within a region over air cavity 110. In this configuration, acoustic impedance layer 140 is retained in the perimeter of the device to provide the benefits of one full mirror pair, namely acoustic isolation between acoustic stack 101 and substrate 105. In addition, it retains the temperature compensation properties provided by acoustic impedance layer 145, typically formed of silicon oxide.

Referring to FIG. 1D, acoustic resonator 100D is substantially the same as acoustic resonator 100B, except that acoustic impedance layer 140 is eliminated. This embodiment still achieves temperature compensation, but it provides somewhat less acoustic isolation between acoustic stack 101 and substrate 105, compared with acoustic resonator 100B. For instance, a typical example of acoustic impedance layer 145, formed of silicon oxide, has an acoustic impedance of about 15 megarayls, while a typical example of substrate 105, formed of silicon, has an acoustic impedance of about 30 megarayls. This acoustic impedance mismatch results in reflection of approximately 50% of the incident acoustic energy. However, with the addition of acoustic impedance layer 140 formed of tungsten, approximately 90% of the acoustic energy may be reflected.

Figure 2A:
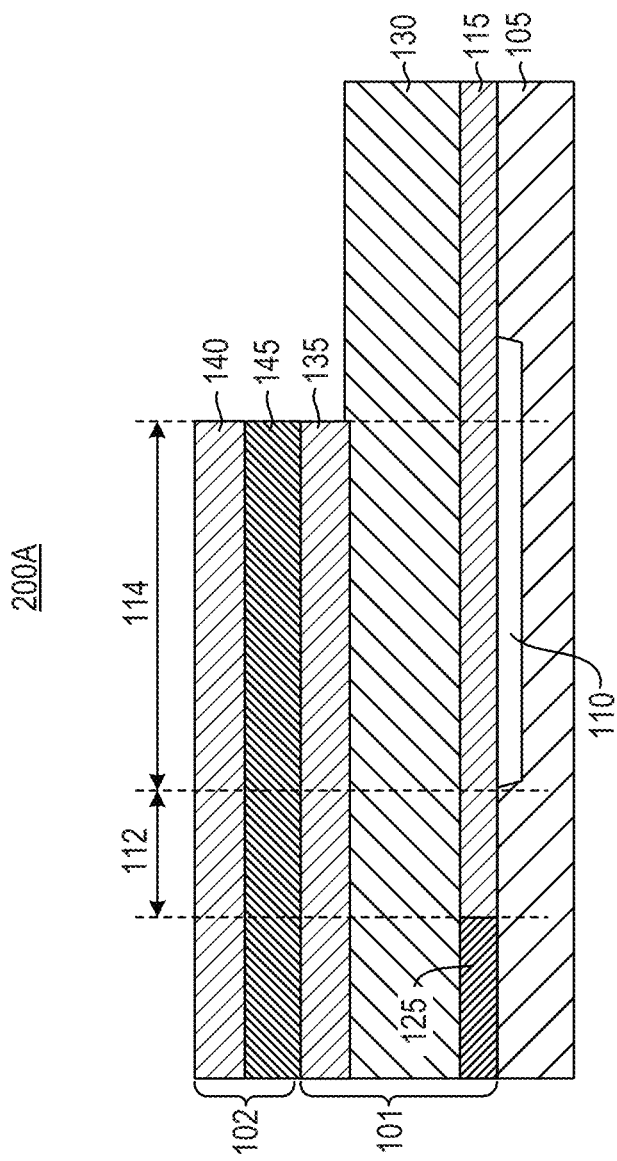
FIG. 2A is a cross-sectional view of an acoustic resonator according to another representative embodiment.

FIGS. 2A and 2B are cross-sectional views of acoustic resonators 200A and 200B according to still other representative embodiments. Acoustic resonators 200A and 200B are substantially the same as acoustic resonators 100B and 100D, respectively, except that acoustic reflector 102 is formed above acoustic stack 101 rather than below it. In each of acoustic resonators 200A and 200B, acoustic impedance layer 145 is formed of a temperature compensating material, such as silicon oxide. As in other embodiments, the use of this material may stabilize the resonator's frequency response with respect to temperature. However, because acoustic reflector 102 is placed above acoustic stack 101, it does not provide the benefit of isolating acoustic stack 101 from substrate 105. In other words, it does not address the dead-FBAR problem. However, one potential benefit of acoustic resonator 200A is that the top acoustic impedance layer may the formed of metal material, which may also serve as a current redistribution layer. The through via may be etched in acoustic impedance layer 145 (that provides temperature compensation) within the dead-FBAR region 112 to facilitate electrical connection between the top acoustic impedance layer 140 and top electrode 135. In such structures series resistance Rs may be lowered, beneficially improving quality factor Q of acoustic resonator 200A around the series resonance frequency Fs.

As an alternative to placing a temperature compensating material in the locations shown in FIGS. 1 and 2, some alternative embodiments may place this material elsewhere. For instance, some embodiments may use an embedded temperature compensating layer within piezoelectric layer 130, e.g., an aluminum nitride layer. Examples of such an embedded temperature compensating layer are disclosed in a U.S. patent application Ser. No. 13/766,993, the subject matter of which is hereby incorporated by reference. In addition, temperature compensating material may be placed in more than one location. For example, various combinations of designs shown in FIGS. 1B-1D and FIGS. 2A-2B may be used without departing the scope of the present teachings, as should be apparent to one skilled in the art.

Figure 3A:
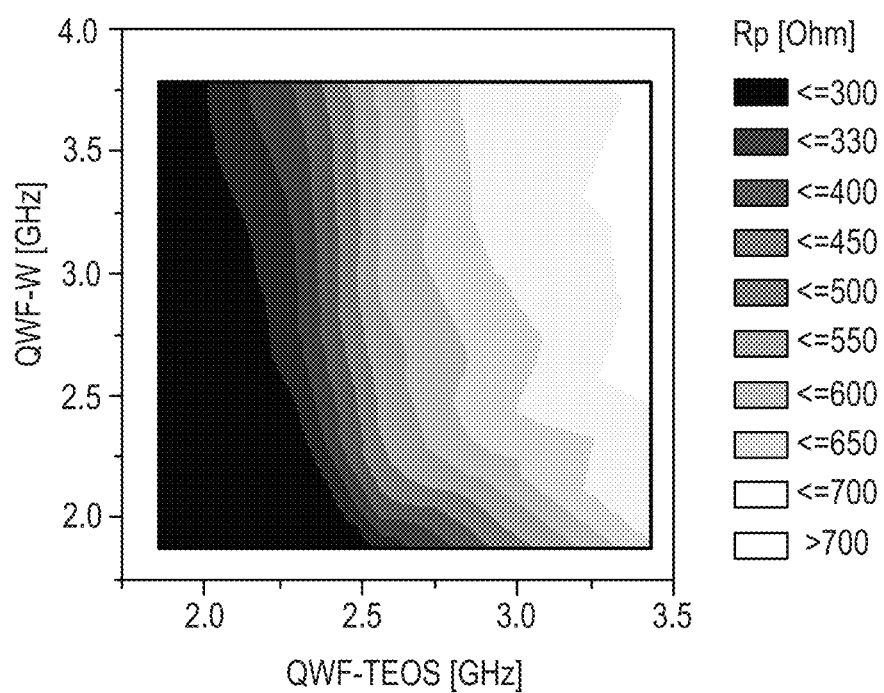
FIG. 3A is a contour plot illustrating the parallel resistance Rp of the FBAR of FIG. 1B as a function of the thicknesses of layers (converted to equivalent quarter-wave frequency) in an acoustic reflector.
Figure 3B:
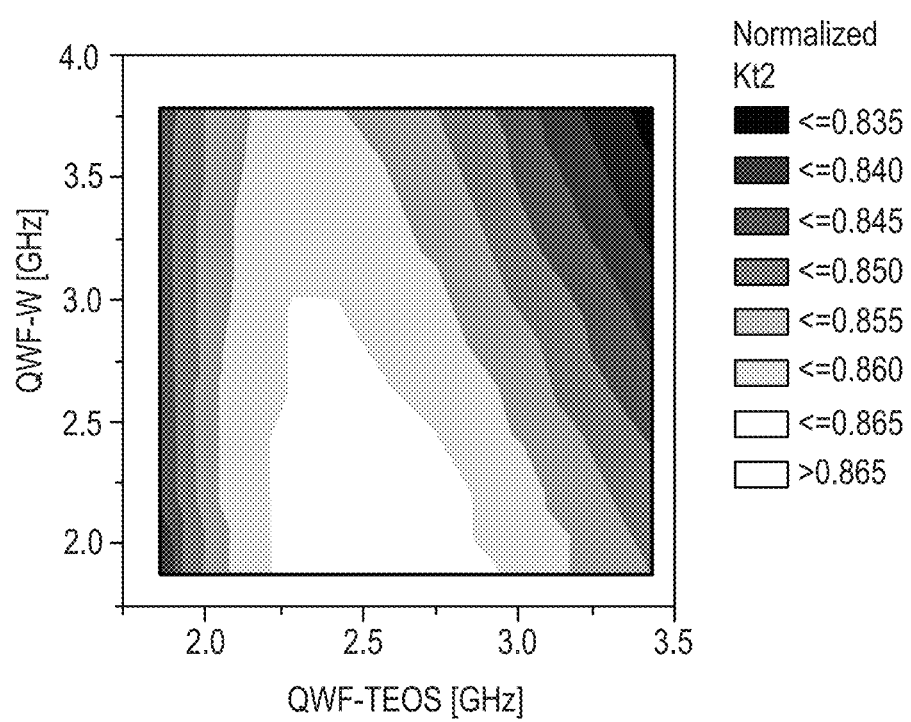
FIG. 3B is a contour plot illustrating the normalized electromechanical coupling coefficient $Kt^2$ of the FBAR of FIG. 1B as a function of the thicknesses of layers (converted to equivalent quarter-wave frequency) in an acoustic reflector.
Figure 3C:
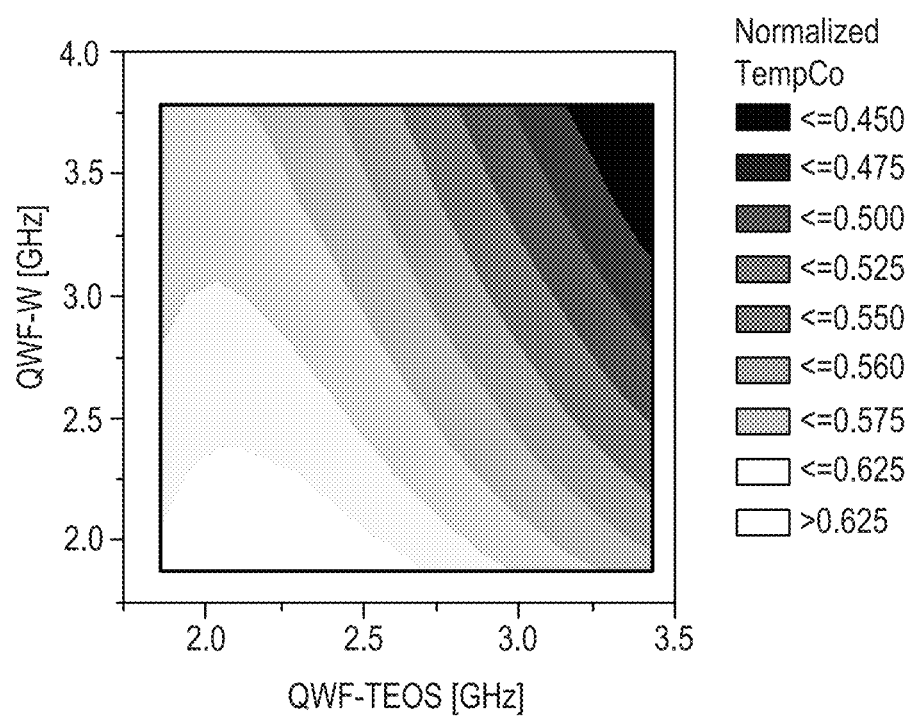
FIG. 3C is a contour plot illustrating the normalized linear coefficient of cutoff frequency change with temperature (TempCo) of the FBAR of FIG. 1B as a function of the thicknesses of layers (converted to equivalent quarter-wave frequency) in an acoustic reflector.
Figure 3D:
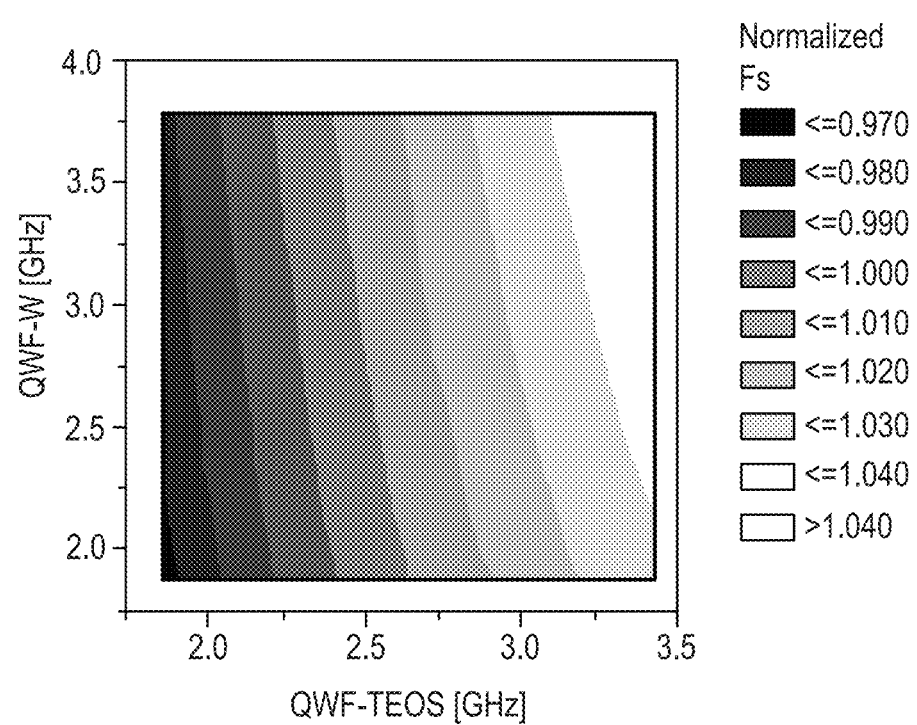
FIG. 3D is a contour plot illustrating the normalized cutoff frequency Fs of the FBAR of FIG. 1B as a function of the thicknesses of layers (converted to equivalent quarter-wave frequency) in an acoustic reflector.

FIGS. 3A through 3D are contour plots illustrating various performance metrics of acoustic resonator 100B of FIG. 1B, as determined by simulation. In particular, FIG. 3A shows the parallel resistance Rp, FIG. 3B shows normalized electromechanical coupling coefficient $Kt^2$, FIG. 3C shows normalized linear coefficient of cutoff frequency Fs change with temperature (TempCo), and FIG. 3D shows normalized cutoff frequency Fs. As indicated above, the term "TempCo" stands for temperature coefficient and describes the rate (in parts-per-million of the cutoff frequency, ppm) at which the cutoff frequency of FBAR 100 changes with changing ambient temperature. In general, the presence of acoustic reflector 102 may improve temperature compensation while potentially diminishing other performance metrics.

Accordingly, one purpose of the simulated results shown in FIGS. 3A through 3D is to determine the amount, if any, of $Kt^2$, Rp, or Fs that is sacrificed for improved temperature compensation.

In each of FIGS. 3A through 3D, the performance metrics are shown as a function of the respective thicknesses of the two layers forming acoustic reflector 102, i.e., acoustic impedance layers 140 and 145. These thicknesses are represented along the x-axis and the y-axis in terms of the corresponding (to a given layer thickness) quarter wavelength frequency (QWF) of acoustic stack 101. The metrics in FIGS. 3B through 3D are normalized with respect to a reference device formed substantially the same as acoustic resonator 100B, but omitting acoustic reflector 102. In the reference device, the values of these metrics are as follows: Rp is approximately 500 ohms, TempCo is approximately −32 ppm, and Fs is approximately 2.03 GHz. The normalized values for acoustic resonator 100B are determined by obtaining simulated values and then dividing the simulated values by the corresponding values for the reference device.

In the simulated version of acoustic resonator 100B, bottom electrode 115 is formed of molybdenum and has a thickness of approximately 3.8 kÅ; piezoelectric layer 130 is formed of aluminum nitride and has a thickness of approximately 9.3 kÅ; top electrode 135 is formed of molybdenum and has a thickness of approximately 3.25 kÅ; and a top passivation layer is formed of aluminum nitride and has a thickness of approximately 2 kÅ.

Acoustic impedance layer 140 is formed of tungsten and its thickness is changed from approximately 3.5 kÅ (QWF is approximately 3.8 GHz) to approximately 7 kÅ (QWF is approximately 1.9 GHz), as indicated along the y-axis of FIGS. 3A-3D. Acoustic impedance layer 145 is formed of silicon oxide and its thickness is changed from approximately 6 kÅ (QWF is approximately 3.4 GHz) to approximately 1.1 kÅ (QWF is approximately 1.85 GHz), as indicated along the x-axis of FIGS. 3A-3D.

As illustrated by FIGS. 3A-3D, in the simulated acoustic resonator 100B, the highest values of Rp are for thicknesses of acoustic impedance layer 145 that is designed for approximately 3.5 GHz device rather than 2 GHz, which is the resonant frequency of the device. These thicknesses are much smaller, about half, of the thickness corresponding to the quarter wavelength specification of a 2 GHz device.

In general, Rp values up to 30 percent higher than the reference device (Rp approximately of 530 ohms for the reference device and Rp approximately of 700 ohms for the best simulated acoustic resonator 100B) can be obtained for acoustic resonator 100B designed for QWF above the cutoff frequency of the reference device. The increase in Rp may be at least in part due to predicted dead-FBAR elimination. The high-Rp design region corresponds to relatively low $Kt^2$ (approximately 15 percent reduction with respect to the reference device) and relatively large improvement in temperature compensation (TempCo is approximately 45 percent of TempCo of a bare-FBAR). Lower $Kt^2$ and better TempCo indicate that acoustic reflector 102 lost some reflectivity due to detuning from thicknesses corresponding to quarter-wave frequencies for acoustic impedance layers 140 and 145, and more acoustic energy penetrates the layers of silicon oxide and W. At the same time, the cutoff frequency Fs of acoustic resonator 100B corresponding to best Rp is pulled up by approximately 4 percent compared to the reference device, due to acoustic reflector 102 being designed at significantly higher QWF than the reference device. As should be appreciated by one skilled in the art, the results presented in FIGS. 3A-3D depend very strongly on material parameters used in the simulations. In reality, some of these parameters (especially related to shear motion, like Poisson ratios) are known only approximately, and so the results presented in FIGS. 3 and 4 (below) are shown for illustrative purposes only.

Figure 4:
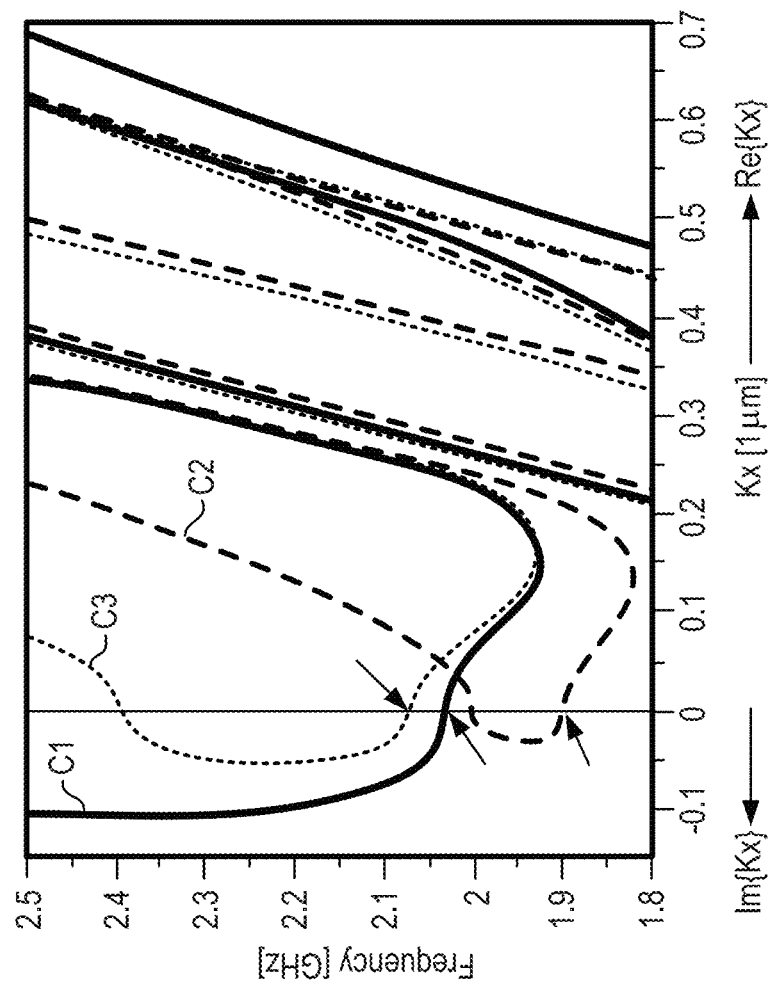
FIG. 4 is an acoustic dispersion diagram comparing the modal structure of three different acoustic resonators.

FIG. 4 is an acoustic dispersion diagram comparing the performance of three different acoustic resonators. The horizontal axis in FIG. 4 corresponds to the lateral wavenumber Kx, with positive numbers indicating real Kx values and negative numbers indicating imaginary Kx values. Each point in FIG. 4 corresponds to an egienmode of specific acoustic polarization and direction of propagation which is supported by a specific stack, as described below. Real Kx value indicates that a given mode is a propagating one (illustratively, it may propagate in a periodic fashion from a point of excitation) while imaginary Kx value indicates that a given mode is an evanescent one (illustratively, it may decay exponentially from a point of excitation). In FIG. 4, a curve C1 illustrates the performance of the reference device described above in relation to FIGS. 3A-3D ("the C1 device"). A curve C2 illustrates the performance of acoustic resonator 100B with acoustic impedance layers 140 and 145 designed with quarter-wavelength thickness at cutoff frequency (approximately 6500 Å thick W layer for acoustic impedance layer 140 of acoustic resonator 100B, approximately 1000 Å thick silicon oxide layer for acoustic impedance layer 145 of acoustic resonator 100B, with simulated Rp of approximately 300 ohms) ("the C2 device"). A curve C3 illustrates the performance of acoustic resonator 100B with Rp about the same as the reference device (approximately 4500 Å thick W for acoustic impedance layer 140 of acoustic resonator 100B, approximately 7500 Å thick silicon oxide layer for acoustic impedance layer 145 of acoustic resonator 100B, with simulated Rp of approximately 500 ohms) ("the C3 device"). The thickness-extensional TE1 mode cutoff frequencies for each design are shown by corresponding arrows at a line where Kx=0.

As illustrated in FIG. 4, the C2 device yields second-order thickness shear (TS2) resonance very close to Fp, which is approximately 50 MHz above the cutoff frequency Fs. The TS2 resonance is indicated by a point on the frequency axis (vertical) where the eigenmode branch crosses Kx=0 line from negative (mode being purely evanescent one) to positive (mode being propagating) Kx values. At any frequency between the cutoff frequency and TS2 frequency there exist an evanescent mode with characteristic (exponential) decay length 1/e given by imaginary part of the wave-number Kx. In general, the smaller Kx value is, the stronger given mode can be excited at structural or electric field discontinuities (for example, top electrode 135 edge is the most important discontinuity in acoustic resonator 100B). If evanescent mode is strongly excited by scattering of the piston mode at the top electrode edges, it results in significant energy loss and resulting lower Rp due to unwanted lateral current flows in bottom and top electrodes 115 and 135, respectively, of acoustic resonator 100B. For the reference C1 device, TS2 resonance is far removed from the TE1 cutoff frequency Fs, but the device suffers significant dead-FBAR loss. The C3 device performance at parallel resonance frequency Fp is comparable to the reference the device C1, but TS2 resonance is closer to the TE1 cutoff frequency than for the C1 device, but farther away than for C2 device.

Analysis of the FIG. 4 reveals that for acoustic resonator 100B designed with acoustic reflector 102 layers corresponding to the resonance frequency (C2 device), there is a possibility of strong coupling of the piston mode to the evanescent mode supported by the structure (branch connecting TE1 and TS2 resonances on the imaginary side of Kx axis). For thinner silicon oxide layers (e.g. the C3 device), the frequency spacing between TE1 and TS2 modes resonances increases, yielding an Rp increase even though overall reflectivity of the acoustic resonator drops as a result of detuning. As mentioned above, this is possible because the strength of excitation of the evanescent mode at the top electrode 135 edge by electric field discontinuity is inversely proportional to the magnitude of the Kx wave-number, for example. Thus the coupling to the evanescent mode decreases as TS2 resonance is moved farther away from the TE1 resonance, resulting in larger magnitude of Kx at the parallel resonance frequency Fp. Therefore, the benefits of removing TS2 resonance form TE1 resonance may outweigh increased contribution of dead-FBAR to overall energy loss, as indicated by the simulated results. For example, it is evident in FIG. 3A that the highest Rp designs are obtained for thin silicon oxide layers, with thicknesses approaching an eight of a designed resonator wavelength rather than expected quarter-wavelength. Therefore, even though silicon oxide thickness corresponding to quarter-wavelength design (device C2) minimizes the dead-FBAR region 112 contribution to the total energy loss, it does not provide highest Rp due to enhanced excitation of the evanescent mode at parallel resonance frequency Fp.

FIGS. 5A through 5F are cross-sectional diagrams of acoustic resonators 500A through 500F according to still other representative embodiments. These acoustic resonators are substantially the same as acoustic resonator 100B of FIG. 1B, except that they further include either composite or add-on frames at the boundaries of active region 114 to further mitigate acoustic losses. This is accomplished by minimizing scattering of electrically excited piston mode and by improving confinement of mechanical motion to active region 114.

Figure 5A:
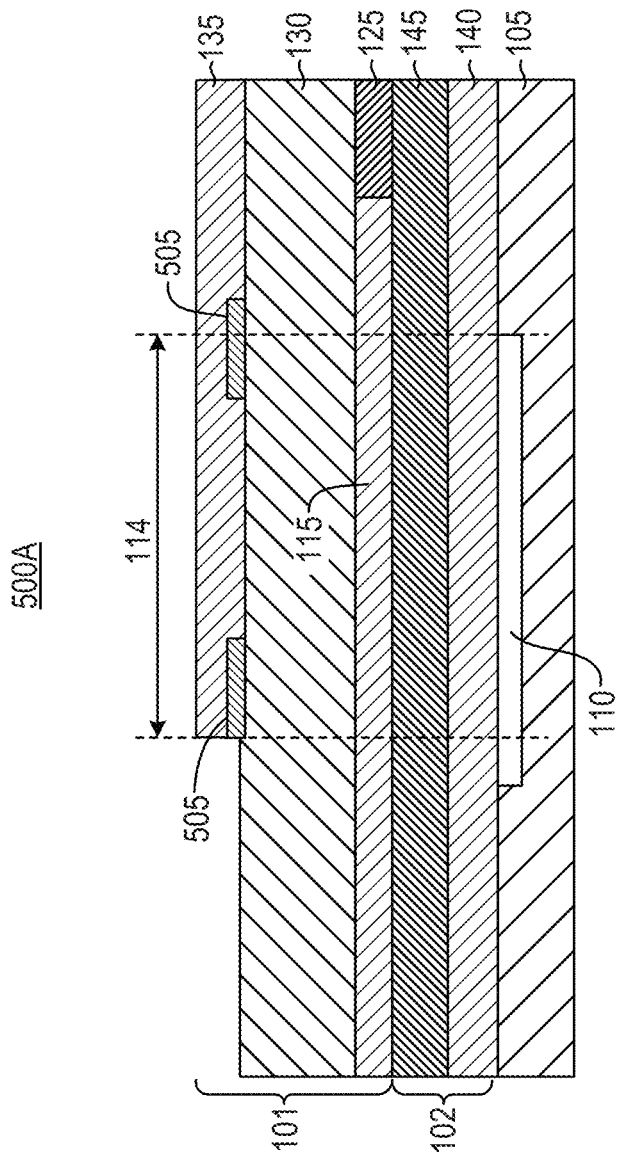
FIG. 5A is a cross-sectional view of an acoustic resonator according to another representative embodiment.
Figure 5B:
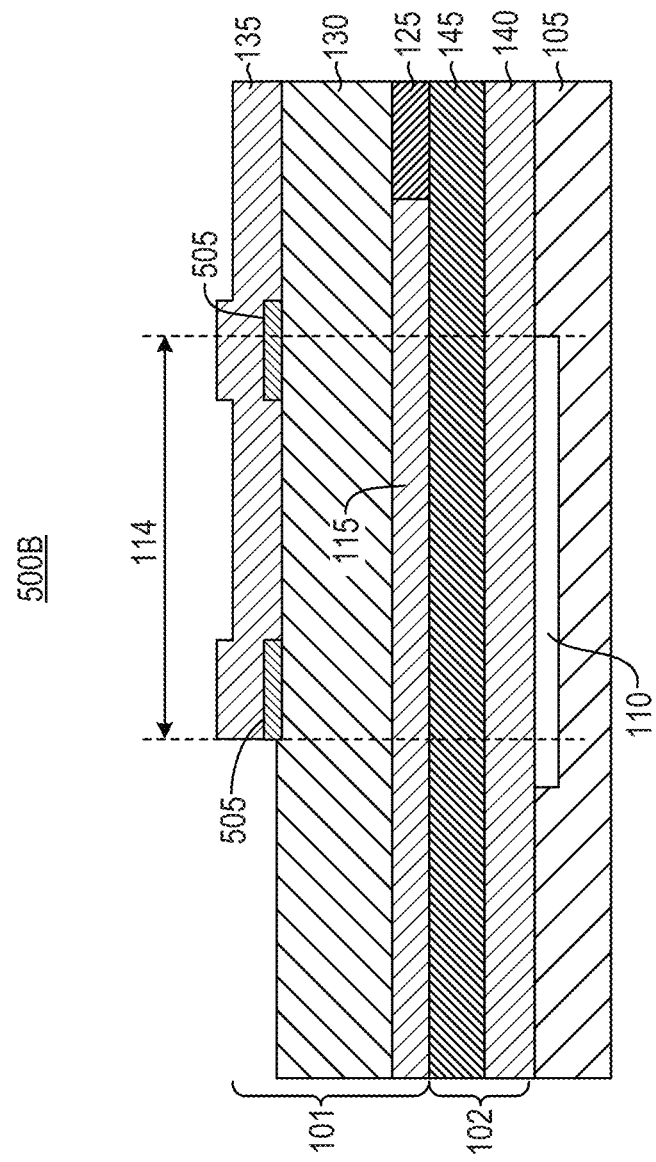
FIG. 5B is a cross-sectional view of an acoustic resonator according to another representative embodiment.
Figure 5C:
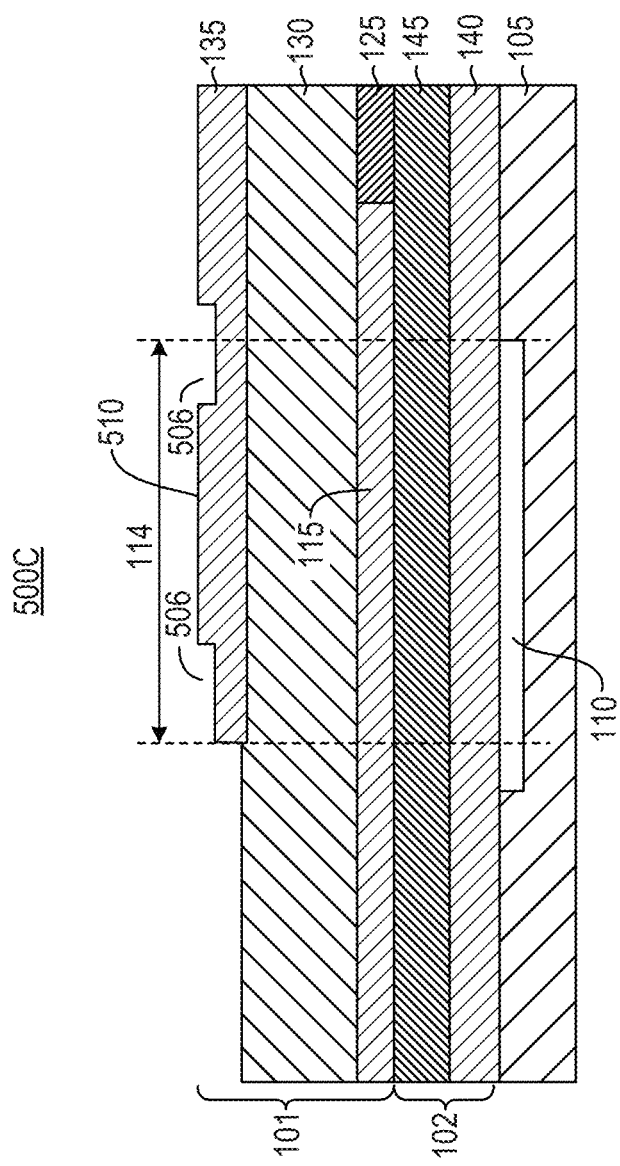
FIG. 5C is a cross-sectional view of an acoustic resonator according to another representative embodiment.
Figure 5D:
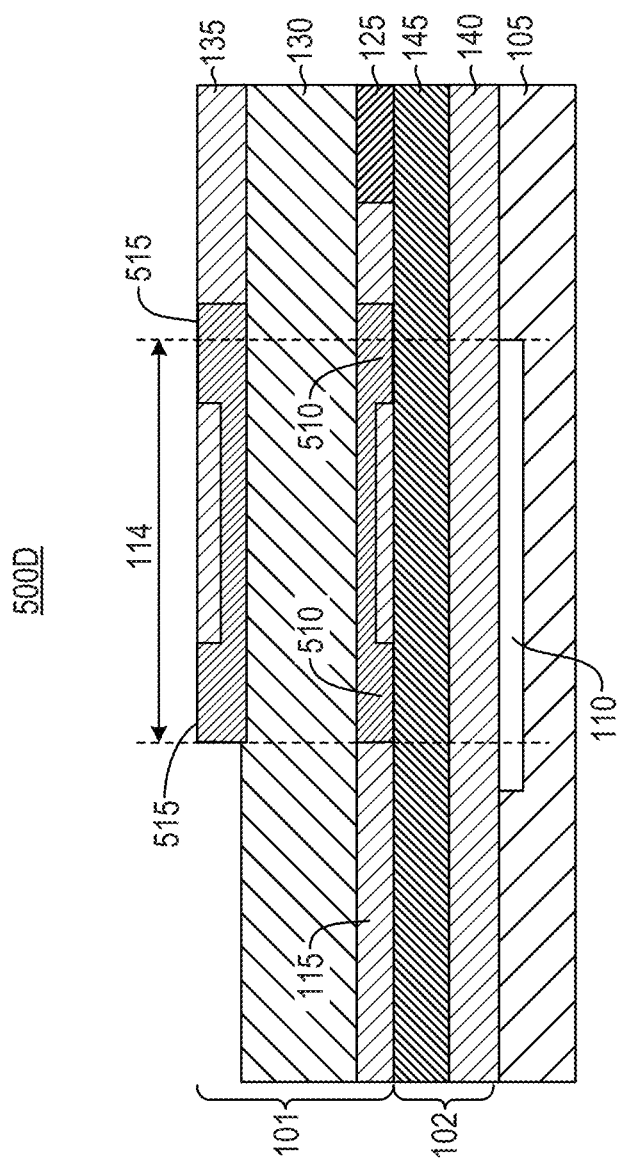
FIG. 5D is a cross-sectional view of an acoustic resonator according to another representative embodiment.
Figure 5E:
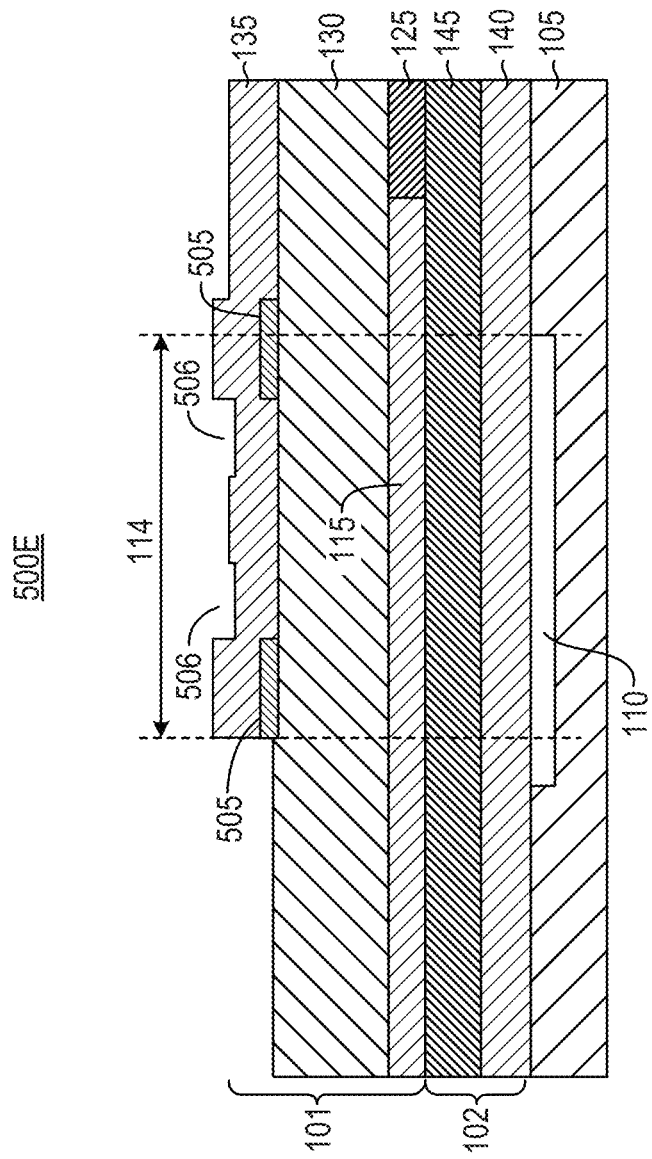
FIG. 5E is a cross-sectional view of an acoustic resonator according to another representative embodiment.
Figure 5F:
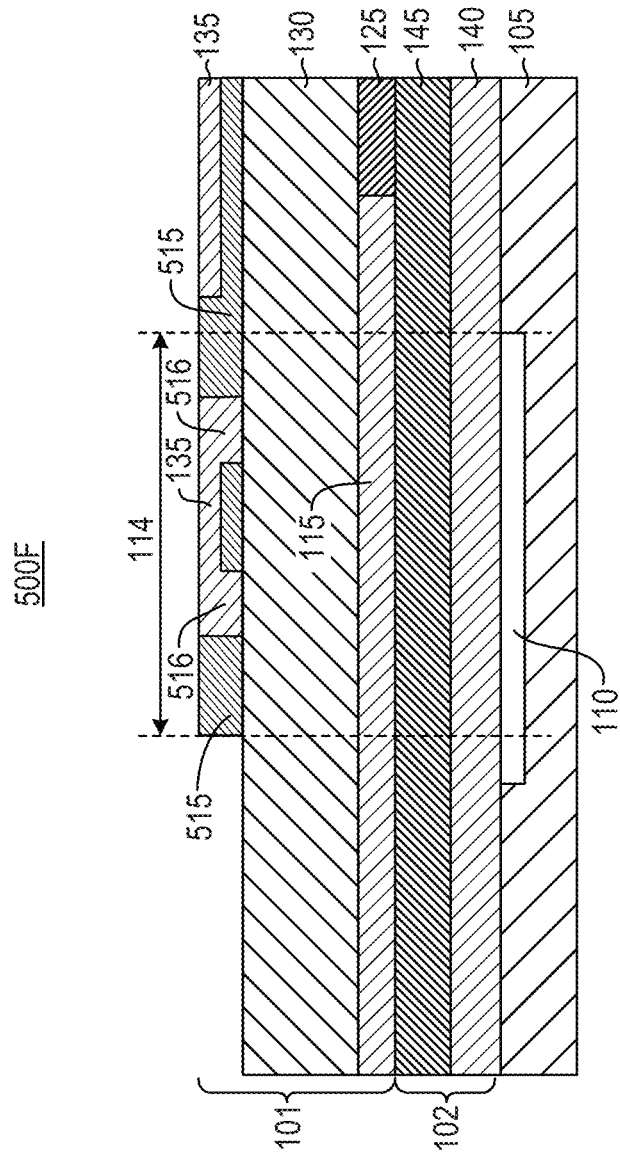
FIG. 5F is a cross-sectional view of an acoustic resonator according to another representative embodiment.

In general, the add-on frames are made of added thin layers of material along the perimeter of active region 114 (or inside the active region 114) with the purpose of lowering (or increasing) the cutoff frequency in that region with respect to the active region. In composite frames, lowering (or increasing) the cutoff frequency in the frame region is accomplished by embedding appropriate material within the electrode in such way that the velocity and acoustic impedance of an insert material in combination with velocities and acoustic impedances of other materials in the stack produces the desired cutoff frequency shift the in the frame region. This shift in cut-off frequency in the frame region relative to the cut-off frequency in the main membrane minimizes the amplitude of the electrically excited piston mode and the resulting scattering at top electrode edges above (or below) the cut-off frequency of a membrane. The frames (either add-on or composite) also create an acoustic impedance mismatch that enables suppression of the amplitudes of propagating and/or evanescent modes (whichever exist in the frequency range of interest) mechanically excited at the boundary, thus further minimizing acoustic energy leakage to the outside of the main membrane and unwanted lateral current flows in the top and bottom electrodes inside the main membrane. Various examples of frames, as well as related materials and operating characteristics, are described in the above cited U.S. patent application Ser. No. 13/663,449, U.S. Patent Publication No. 2008/0258842, and U.S. Pat. No. 6,548,943. As explained in those documents, frames can be placed in various locations and configurations relative to other portions of an acoustic resonator, such as the electrodes and piezoelectric layer of an acoustic stack. Additionally, their dimensions, materials, relative positioning, and so on, can be adjusted to achieve specific design objectives, such as a target resonant frequency, Rp, or $Kt^2$. Nevertheless, to provide concrete examples, FIGS. 5A through 5F show various non-limiting configurations in which frames (either add-on, or composite, or both) may be used in conjunction with a temperature compensating acoustic reflector as described above. Of particular note, the frames illustrated in FIG. 5A, FIG. 5D and FIG. 5F are composite frames and the frames illustrated in FIG. 5B, FIG. 5C and FIG. 5E are add-on frames. As should be apparent to one skilled in the art both add-on and composite frames can be used interchangeably in order to achieve the desired performance improvements as specified by the final product (e.g. RF filter) requirements. In general, however, the use of add-on frames may interfere with the growth and integrity of subsequently formed layers, but they may be easier to manufacture.

Referring to FIGS. 5A through 5F, acoustic resonator 500A comprises a composite frame 505 formed between piezoelectric layer 130 and top electrode 135. Depending on the choice of materials used for the bottom electrode 115, the top electrode 135 and the composite frame 505, this frame can be configured to provide either down-shift or up-shift of the cut-off frequency in the frame region as compared to the cut-off frequency in the main membrane. When viewed from the top of acoustic resonator 500A (see, e.g., FIG. 1A), composite frame 505 may form a ring that surrounds or substantially surrounds a portion of active region 114. A similar type of ring structure may also be formed by frames in the other embodiments of FIGS. 5B through 5F. Similarly, acoustic resonator 500B comprises an add-on frame 510 formed between piezoelectric layer 130 and top electrode 135 and configured to provide down-shift of the cut-off frequency in the frame region as compared to cut-off frequency in the main membrane. Acoustic resonator 500C comprises an add-on frame 510 formed on top of the top electrode 135 configured to provide up-shift of the cut-off frequency in the frame region as compared to cut-off frequency in the main membrane. This is accomplished by adding a thin layer of material to form add-on frame 510 to the central region of acoustic resonator 500C, as indicated in FIG. 5C, which equivalently forms depression region 506 characterized by a desired higher cut-off frequency than the central part of active region 114. Acoustic resonator 500D comprises composite frame 510 and a composite frame 515. If the material used for frames 510 and 515 is of lower velocity and higher acoustic impedance (e.g. W) as compared to the metal used for the bottom electrode 115 and the top electrode 135 (e.g. Mo), the frame would be configured to provide down-shift of cut-off frequency in the frame region as compared to the cut-off frequency in the main membrane yielding improvements of performance at the parallel resonance frequency Fp. In addition to that, layer of high acoustic impedance material along the lower and upper boundaries of piezoelectric layer 130 would yield increased electromechanical coupling coefficient $Kt^2$, which may be beneficial for some applications. Acoustic resonator 500E combines frames from FIG. 5B and FIG. 5C and comprises two add-on frames side by side, with composite frame 505 configured to provide down-shift of cut-off frequency and add-on frame 510 configured to provide an up-shift of cut-off frequency, as compared to the cut-off frequency of the central portion of acoustic resonator 500E. Such a design may produce an improvement in quality factor Q of the acoustic resonator 500E both below and above the cutoff frequency. Finally, acoustic resonator 500F comprises two composite frames side by side, providing opposite shifts of the cut-off frequencies, by analogy to FBAR 5E. If the material used for frames 515 has lower velocity and higher acoustic impedance (e.g. W) as compared to the metal used for the bottom electrode 115 and the top electrode 135 (e.g. Mo), the frames 515 would be configured to provide a down-shift of cut-off frequency in the frame region as compared to the cut-off frequency in the main membrane, while frame 516 would be configured to provide an up-shift of cut-off frequency in the frame region as compared to the cut-off frequency in the main membrane. Similar to acoustic resonator 500E, such a design may produce and improvement in the quality factor Q of the acoustic resonator 500F both below and above the cutoff frequency.

Figure 6:
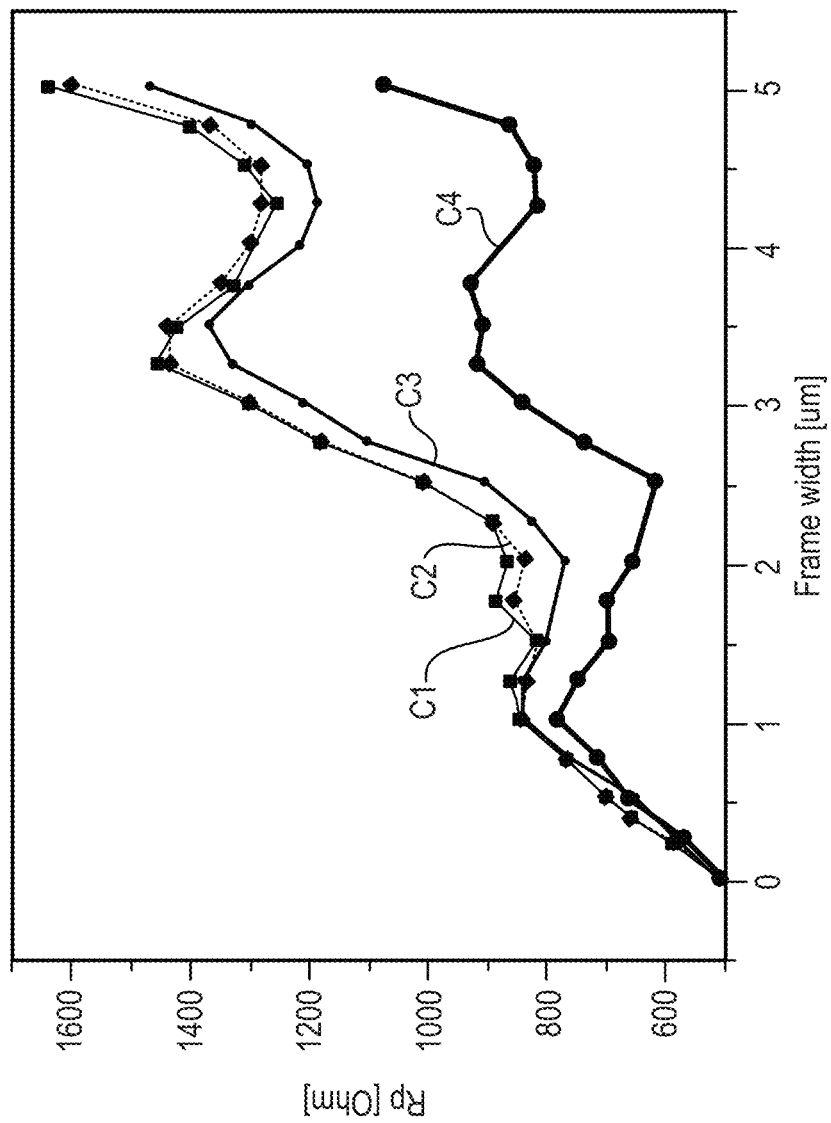
FIG. 6 is a graph illustrating the parallel resistance Rp of the acoustic resonator of FIG. 5A as a function of the width of a composite frame.

FIG. 6 is a graph illustrating the parallel resistance Rp of acoustic resonator 500A as a function of the width of composite frame 505. In the example of FIG. 6, four curves C1 through C4 correspond to four different simulations of acoustic resonator 500A in which composite frame 505 is of Al/Mo composite, with four different Al thicknesses: 350 Å, 500 Å, 1000 Å and 2000 Å. Because Al has comparable sound velocity with Mo but approximately 30 percent lower acoustic impedance, such structure forms a weak low-velocity frame as compared to that of the active area 114 of the acoustic resonator stack. In other words, the TE1 mode cutoff frequency in the frame region is below the TE1 cutoff frequency in the active area 115. The reason for this behavior is that low impedance Al layer allows for more energy to penetrate through both the Al layer forming the frame and the top Mo layer making the top Al frame layer and the Mo layer contributions to the total sound velocity of the stack larger. Because sound velocity of Mo layer is approximately 40 percent lower than sound velocity in AlN, the increased contribution to sound velocity from the Al frame layer and top Mo layer lowers the overall sound velocity in the stack, effectively creating a low velocity frame. In a typical add-on frame configuration, where a layer of material is simply added in the frame region (like for acoustic resonator 500B, shown in FIG. 5B), the effective low velocity (or, equivalently, down-shifted cut-off frequency) is obtained by increasing the round-trip path of a sound wave between the bottom and the top of the stack. In contrast, in the integrated composite frame described above (like for acoustic resonator 500A, shown in FIG. 5A) the effective low velocity of the stack is obtained by increasing contributions from lower-velocity Mo and Al layers to the weighted sum of all velocities from materials comprising the stack in the composite frame region.

In the simulated example, the other features of acoustic resonator 500A have materials and thicknesses as follows. Bottom electrode 115 is formed of Mo with a thickness of approximately 3800 Å. Piezoelectric layer 130 is formed of AlN with a thickness of approximately 9300 Å. Top electrode 135 is formed of Mo with a thickness of approximately 3250 Å. A passivation layer of AlN is formed on top electrode with a thickness of approximately 2000 Å. Acoustic impedance layer 145 is formed of silicon oxide with a thickness of approximately 7500 Å. Acoustic impedance layer 140 is formed of W with a thickness of approximately 4500 Å. Note that the acoustic dispersion diagram for this stack corresponds to device C3 shown in FIG. 4. Without any frames this device yields Rp of approximately 500 ohms, which is approximately the same as Rp of device C1 (shown in FIG. 4) that does not contain any temperature compensating features.

As illustrated in FIG. 6, the parallel resistance Rp of acoustic resonator 500A is a periodic function of the width of composite frame 505. In addition, thinner Al/Mo frames yield better peak Rp improvement, at least for the simulated range of Al layer thicknesses. The best simulated Rp improvement is over 3 times, from approximately 500 ohms to approximately 1600 ohms for a 350 Å and 500 Å thick, 5 μm wide composite frame 505, as indicated by traces C1 and C2, respectively. Note that simulated Rp improvement combines beneficial contributions from the frame itself as well as beneficial contributions from temperature compensating acoustic reflector 102 which eliminates energy loss through dead-FBAR region (defined as an overlap between the bottom electrode 115, piezoelectric layer 130, top electrode 135 and the substrate 105 in FIG. 5A, for example).

Figure 7:
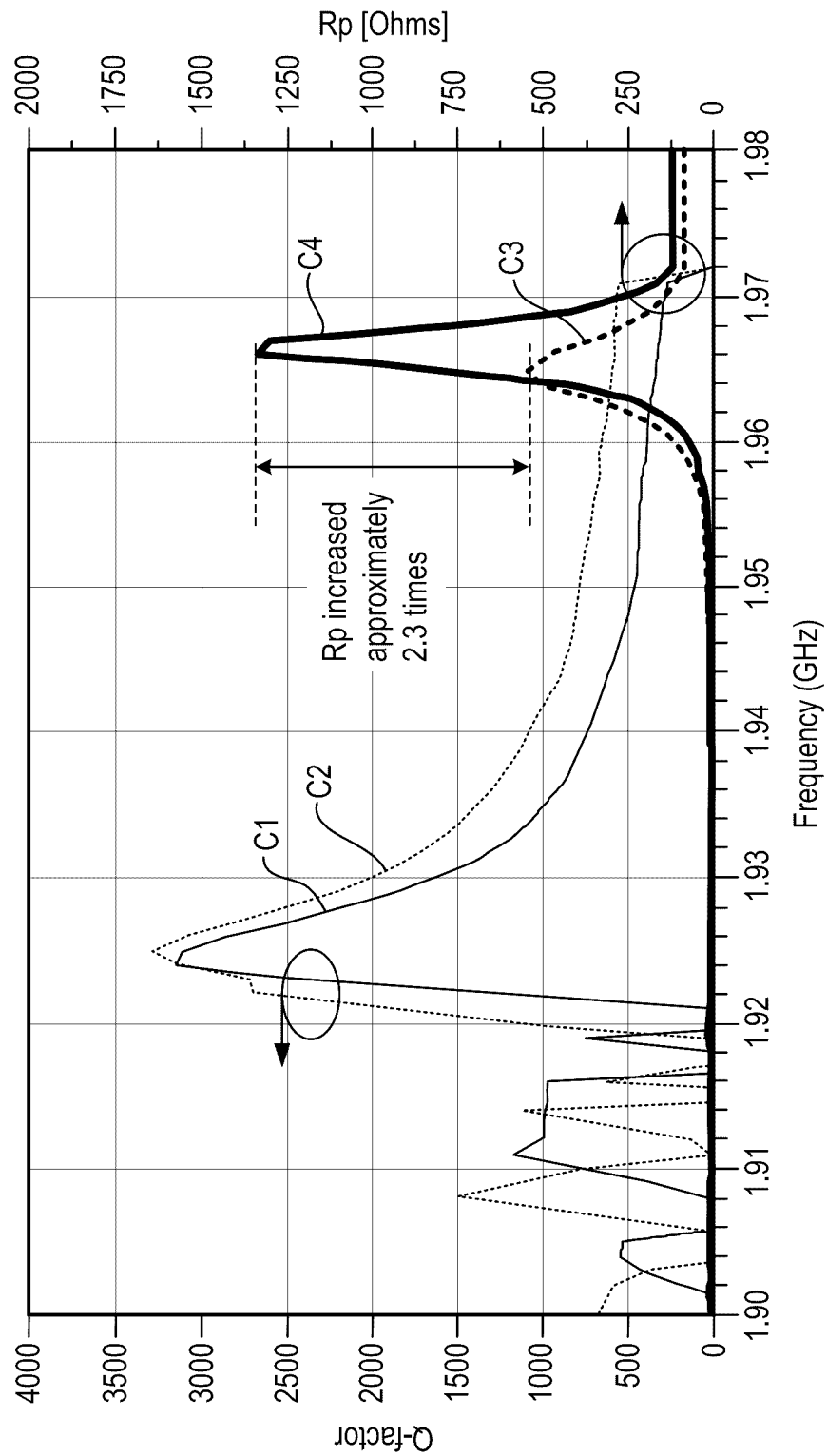
FIG. 7 is a graph illustrating the quality factor (Q-factor) and parallel resistance Rp of the respective FBARs of FIGS. 1B and 5A.

FIG. 7 is a graph illustrating the simulated Q-factor and parallel resistance Rp of the respective FBARs of FIGS. 1B and 5A. The purpose of this graph is to illustrate changes in performance of the pass-band spectral range that occur as a consequence of adding frame 505 to acoustic resonator 100B. In the example of FIG. 7, the dimensions of acoustic resonator have been tuned for high Rp, as described above in relation to FIG. 3A and FIG. 6. Frame 505 is formed of an Al/Mo composite, with a width of 3.75 μm and a thickness of 350 Å.

Referring to FIG. 7, Q-factor is represented by a y-axis on the left side, and Rp is represented by a y-axis on the right side. The values of the Q-factor and Rp are shown as a function of input signal frequency.

A first curve C1 illustrates the Q-factor of acoustic resonator 100B, and a second curve C2 illustrates the Q-factor of acoustic resonator 500A. A third curve C3 illustrates the Rp value of acoustic resonator 100B, and a fourth curve C4 illustrates the Rp value of acoustic resonator 500A. More specifically, curves C3 and C4 illustrate magnitudes of complex-valued electrical impedance of acoustic resonators 100B and 500A, respectively. At parallel resonance frequency Fp electrical impedance becomes approximately real-valued and the peak value of electrical impedance magnitude indicates parallel resistance Rp.

A peak value of the Q-factor occurs for each of the devices at about 1.925 GHz. This frequency corresponds to the series resonance frequency Fs of the respective devices. Similarly, a peak value of Rp occurs for each of the two devices at about 1.965 GHz. This frequency corresponds to the parallel resonance frequency Fp of the respective devices. The bandwidth of these devices corresponds to the range of frequencies between their respective values of Fs and Fp. Accordingly, in this example, the two devices have similar bandwidths.

At frequencies above Fs, acoustic resonator 500A has significantly higher Q-factor than acoustic resonator 100B. In addition, as illustrated by the respective peaks of third and fourth curves C3 and C4, acoustic resonator 500A has a significantly higher Rp value than acoustic resonator 100B. In particular, acoustic resonator 500A has an Rp value of about 1300 Ohms while acoustic resonator 100B has an Rp value of about 550 Ohms. As should be appreciated by one of ordinary skill in the art, the Rp value of acoustic resonator 500A is increased by approximately 2.3 times without any significant degradation of the bandwidth when compared to acoustic resonator 100B. It should be pointed out that because of complexity of the FBAR manufacturing process, simplifying assumptions used in the simulations and uncertainties regarding material parameters, the results presented in FIGS. 6 and 7 are provided for illustrative purposes only.

In the above-described embodiments, the temperature compensating DBR and frames can generally be formed using conventional processing techniques, with examples including various forms of deposition, etching, polishing, and so on. Moreover, the described embodiments and related methods of fabrication can be modified in various ways as will be apparent to those skilled in the art.

While example embodiments are disclosed herein, one of ordinary skill in the art appreciates that many variations that are in accordance with the present teachings are possible and remain within the scope of the appended claims. For instance, as indicated above, the location, dimensions, and materials of a temperature compensating DBR and/or frames can be variously altered. In addition, other features can be added and/or removed to further improve various performance characteristics of the described devices. These and other variations would become clear to one of ordinary skill in the art after inspection of the specification, drawings and claims herein. The invention therefore is not to be restricted except within the spirit and scope of the appended claims.

The invention claimed is:

1. An acoustic resonator structure, comprising:
a substrate having an air cavity;
an acoustic stack disposed over the substrate and comprising a piezoelectric layer disposed between a first electrode and a second electrode;
an acoustic reflector disposed on the substrate between the air cavity and the acoustic stack, the acoustic reflector comprising a single pair of acoustic impedance layers configured to reflect acoustic waves produced by vibration of the acoustic stack, wherein at least one of the acoustic impedance layers comprises a temperature compensating material; and
a planarization layer disposed beneath the piezoelectric layer and adjacent to the first electrode, wherein a first layer among the single pair of acoustic impedance layers is formed adjacent to the substrate and a second layer among the single pair of acoustic impedance layers comprises the temperature compensating material, wherein the first layer is etched in a region over the air cavity such that a portion of the second layer is exposed to the air cavity.

2. The acoustic resonator structure of claim 1, wherein the temperature compensating material comprises a form of undoped or doped silicon oxide.

3. The acoustic resonator structure of claim 2, wherein the first layer among the single pair of the acoustic impedance layers comprises a high acoustic impedance material selected from a group consisting of tungsten, molybdenum, iridium, copper, aluminum, diamond, diamond-like carbon, aluminum oxide, silicon nitride, aluminum nitride, zinc oxide and silicon carbide.

4. The acoustic resonator structure of claim 1, wherein the first electrode is disposed between the acoustic reflector and the piezoelectric layer, and the acoustic resonator structure further comprises a frame disposed around an active region of the acoustic stack between the second electrode and the piezoelectric layer.

5. The acoustic resonator structure of claim 4, wherein the frame comprises an add-on frame or a composite frame, or both, wherein the add-on frame up-shifts a cut-off frequency of a frame region compared to a cut-off frequency of a main membrane, and the composite frame down-shifts a cut-off frequency of a frame region compared to the cut-off frequency of the main membrane, respectively.

6. The acoustic resonator structure of claim 4, wherein the frame comprises a first frame and a second frame, wherein the first frame up-shifts a cut-off frequency of a frame region compared to a cut-off frequency in a main membrane, and the second frame down-shifts a cut-off frequency of a frame region compared to the cut-off frequency of the main membrane, respectively.

7. The acoustic resonator structure of claim 1, wherein the first electrode is disposed between the acoustic reflector and the piezoelectric layer, and the acoustic resonator structure further comprises a frame disposed around an active region of the acoustic stack between the first electrode and the acoustic reflector.

8. The acoustic resonator structure of claim 1, further comprising first and second frames connected to the acoustic stack in a side by side configuration, wherein the first frame is disposed in a first frame region and is configured to shift a cutoff frequency of the first frame region in a first direction, and wherein the second frame is disposed in a second frame region and is configured to shift a cutoff frequency of the second frame region in a second direction opposite the first direction.

9. The acoustic resonator structure of claim 8, wherein the first electrode is disposed between the acoustic reflector and the piezoelectric layer, and the first and second frames are connected to one of the first and the second electrodes.

10. The acoustic resonator structure of claim 9, wherein each of the first and second frames is one of an add-on and a composite frame.

11. The acoustic resonator structure of claim 1, wherein each of the acoustic impedance layers has a thickness in a range of approximately an eighth to a half of a wavelength of a resonance frequency of the acoustic stack.

12. The acoustic resonator structure of claim 1, wherein the acoustic impedance layer comprising the temperature compensating material has a thickness approximately equal to an eighth wavelength of a resonance frequency of the acoustic stack.

13. An acoustic resonator structure, comprising:
a substrate having an air cavity;
an acoustic stack disposed over the substrate and comprising a piezoelectric layer disposed between a first electrode and a second electrode; an acoustic reflector disposed over the substrate and comprising a single acoustic impedance layer comprising a temperature compensating material and configured to reflect acoustic waves produced by vibration of the acoustic stack, wherein the acoustic stack is disposed between the substrate and the single acoustic impedance layer; and
a planarization layer disposed beneath the piezoelectric layer and adjacent to the first electrode.

14. The acoustic resonator structure of claim 13, wherein the temperature compensating material comprises a form of undoped or doped silicon oxide.

15. The acoustic resonator structure of claim 13, further comprising a frame disposed around an active region of the acoustic stack and between the single acoustic impedance layer and the second electrode.

16. The acoustic resonator structure of claim 15, further comprising another frame disposed around the active region of the acoustic stack and between the single acoustic impedance layer and the second electrode, in a side by side configuration with the frame.

17. An acoustic resonator structure, comprising:
a substrate having an air cavity;
an acoustic stack disposed over the substrate and comprising a piezoelectric material disposed between a first electrode and a second electrode; and
an acoustic reflector disposed over the substrate and between the air cavity and the acoustic stack, the acoustic reflector comprising a single pair of acoustic impedance layers configured to reflect acoustic waves produced by vibration of the acoustic stack, wherein a first layer among the single pair of acoustic impedance layers is formed adjacent to the substrate and a second layer among the single pair of acoustic impedance layers comprises the temperature compensating material, wherein the first layer is etched in a region over the air cavity such that a portion of the second layer is exposed to the air cavity.

18. The acoustic resonator structure of claim 17, wherein the temperature compensating material comprises a form of undoped or doped silicon oxide.

19. The acoustic resonator structure of claim 18, wherein the first layer among the single pair of the acoustic impedance layers comprises a high acoustic impedance material selected from a group consisting of tungsten, molybdenum, iridium, copper, aluminum, diamond, diamond-like carbon, aluminum oxide, silicon nitride, aluminum nitride, zinc oxide and silicon carbide.

20. The acoustic resonator structure of claim 17, wherein the first electrode is disposed between the acoustic reflector and the piezoelectric layer, and the acoustic resonator structure further comprises a frame disposed around an active region of the acoustic stack between the second electrode and the piezoelectric layer.

21. The acoustic resonator structure of claim 20, wherein the frame is an add-on frame or a composite frame.

22. The acoustic resonator structure of claim 17, wherein the first electrode is disposed between the acoustic reflector and the piezoelectric layer, and the acoustic resonator structure further comprises a frame disposed around an active region of the acoustic stack between the first electrode and the acoustic reflector.

23. The acoustic resonator structure of claim 17, further comprising first and second frames connected to the acoustic stack in a side by side configuration, wherein the first frame is disposed in a first frame region and is configured to shift a cutoff frequency of the first frame region in a first direction, and wherein the second frame is disposed in a second frame region and is configured to shift a cutoff frequency of the second frame region in a second direction opposite the first direction.

24. The acoustic resonator structure of claim 23, wherein the first electrode is disposed between the acoustic reflector and the piezoelectric layer, and the first and second frames are connected to one of the first and the second electrodes.

25. The acoustic resonator structure of claim 24, wherein each of the first and second frames is one of an add-on and a composite frame.

26. The acoustic resonator structure of claim 25, wherein each of the acoustic impedance layers has a thickness in a range of approximately an eighth to a half of a wavelength of a resonance frequency of the acoustic stack.

27. The acoustic resonator structure of claim 25, wherein the acoustic impedance layer comprising the temperature compensating material has a thickness approximately equal to an eighth wavelength of a resonance frequency of the acoustic stack.

* * * * *